(12) United States Patent
Skinner

(10) Patent No.: US 7,928,734 B2
(45) Date of Patent: Apr. 19, 2011

(54) UNIVERSAL VOLTAGE MONITORING AND SWITCHING DEVICE

(75) Inventor: Robert Skinner, Lebanon, OR (US)

(73) Assignee: Roadmaster, Inc., Vancouver, WA (US)

( * ) Notice: Subject to any disclaimer, the term of this patent is extended or adjusted under 35 U.S.C. 154(b) by 174 days.

(21) Appl. No.: 11/858,631

(22) Filed: Sep. 20, 2007

(65) Prior Publication Data

US 2008/0116896 A1 May 22, 2008

Related U.S. Application Data

(60) Provisional application No. 60/867,017, filed on Nov. 22, 2006.

(51) Int. Cl.
*G01R 31/02* (2006.01)
(52) U.S. Cl. .................. 324/418; 340/426.32; 340/453; 340/479; 303/123; 303/24.1

(58) Field of Classification Search .................. 324/418
See application file for complete search history.

(56) References Cited

U.S. PATENT DOCUMENTS

| 5,886,628 | A  | * | 3/1999  | Alhassoon | 340/479 |
|-----------|----|---|---------|-----------|---------|
| 6,225,918 | B1 | * | 5/2001  | Kam       | 340/903 |
| 6,499,814 | B1 | * | 12/2002 | Mixon     | 303/124 |
| 6,744,361 | B1 | * | 6/2004  | Maddox    | 340/479 |
| 7,298,148 | B2 | * | 11/2007 | Drake et al. | 324/421 |
| 2005/0086797 | A1 | * | 4/2005 | Popescu   | 29/622  |

* cited by examiner

*Primary Examiner* — Timothy J Dole
*Assistant Examiner* — Benjamin M Baldridge
(74) *Attorney, Agent, or Firm* — Ian F. Burns & Associates, P.C.

(57) ABSTRACT

A monitoring and switching device for use with a towed vehicle includes a relay circuit that has a pair of terminals that are adapted to be connected with another circuit. A detection circuit is in communication with the relay circuit. The detection circuit can detect closing of the relay circuit and send an electrical signal that the relay circuit has been closed.

19 Claims, 5 Drawing Sheets

UNIVERSAL VOLTAGE MONITORING AND SWITCHING DEVICE

BACKGROUND

1. Field of the Invention

The present invention relates to auxiliary braking systems. In particular, the present invention relates to a brake light switching and monitoring device that may be used with a towed vehicle.

2. Description of the Related Art

In some situations, when a vehicle is being towed, the towed vehicle relies on the braking system of the towing vehicle for stopping or slowing down. This situation typically produces undue stress on the towing vehicle's braking system. As a result, the life span of the towing vehicle's braking system could be significantly shortened. For instance, the brake pads of the towing vehicle could wear out faster. This situation may pose a risk that the towing vehicle will lose its brakes, perhaps causing an accident.

Furthermore, significant stress on the vehicle connection system, such as the hitch, may result when the towing vehicle stops or slows down the towed vehicle. If stress exceeds the structural strength of the hitch, catastrophic failure of the hitch may result. In such an event, the towed vehicle may become decoupled from the towing vehicle.

Auxiliary braking systems have been developed to try to solve these types of problems. Some jurisdictions require the use of auxiliary braking systems, especially when the vehicle being towed is heavy.

Some auxiliary braking systems require tapping into or replacing connections to the towed vehicle brake light switch in order to properly operate. The brake light switch in a towed vehicle senses the depression of the brake pedal and turns on the brake lights of the towed vehicle.

The brake light switch is typically positioned under the dashboard in a location that makes cutting and splicing additional wires an uncomfortable and arduous task. In addition, there are a large number of wires running under the dashboard. It can be difficult to select and cut the correct brake light switch wire. Cutting and replacing wires under a dashboard requires substantial labor and time to install. What has long been needed is a voltage monitoring and switching device that does not suffer from at least some of the disadvantages of the prior art devices.

SUMMARY

Advantages of One or More Embodiments of the Present Invention

The various embodiments of the present invention may, but do not necessarily, achieve one or more of the following advantages:

provide a device that can detect the presence of a voltage;

provide a voltage monitoring and switching device that can be readily connected with a brake light switch;

provide a voltage monitoring and switching device that can be connected without having to cut a brake light switch wire;

provide an electrical signal to a monitor that a brake pedal has been depressed;

provide a brake light monitoring device that does not require tapping into the brake light switch of the vehicle being towed;

provide an auxiliary braking device that may be easily assembled or set-up; and provide feedback that the braking device for a towed vehicle is functioning correctly.

These and other advantages may be realized by reference to the remaining portions of the specification, claims, and abstract.

BRIEF DESCRIPTION OF EMBODIMENTS OF THE PRESENT INVENTION

The present invention comprises a monitoring and switching device for use with a towed vehicle. The monitoring and switching device includes a relay circuit that has a pair of terminals that are adapted to be connected with another circuit. A detection circuit is in communication with the relay circuit. The detection circuit can detect closing of the relay circuit and send an electrical signal that the relay circuit has been closed.

The present invention also includes a method of monitoring a brake light switch. The method includes monitoring a brake light fuse with a relay circuit. Closing the relay circuit and detecting closing of the relay circuit using a detection circuit. A signal is then sent that the relay circuit has been closed using the detection circuit.

The above description sets forth, rather broadly, a summary of embodiments of the present invention so that the detailed description that follows may be better understood and contributions of the present invention to the art may be better appreciated. Some of the embodiments of the present invention may not include all of the features or characteristics listed in the above summary. There may be, of course, other features of the invention that will be described below and may form the subject matter of claims. In this respect, before explaining at least one embodiment of the invention in detail, it is to be understood that the invention is not limited in its application to the details of the construction and to the arrangement of the components set forth in the following description or as illustrated in the drawings. The invention is capable of other embodiments and of being practiced and carried out in various ways. Also, it is to be understood that the phraseology and terminology employed herein are for the purpose of description and should not be regarded as limiting.

DETAILED DESCRIPTION

In the following detailed description of one embodiment, reference is made to the accompanying drawings, which form a part of this application. The drawings show, by way of illustration, exemplary embodiments in which the invention may be practiced. It is to be understood that other embodiments may be utilized and/or structural changes may be made without departing from the scope of the present invention.

Figure 1:
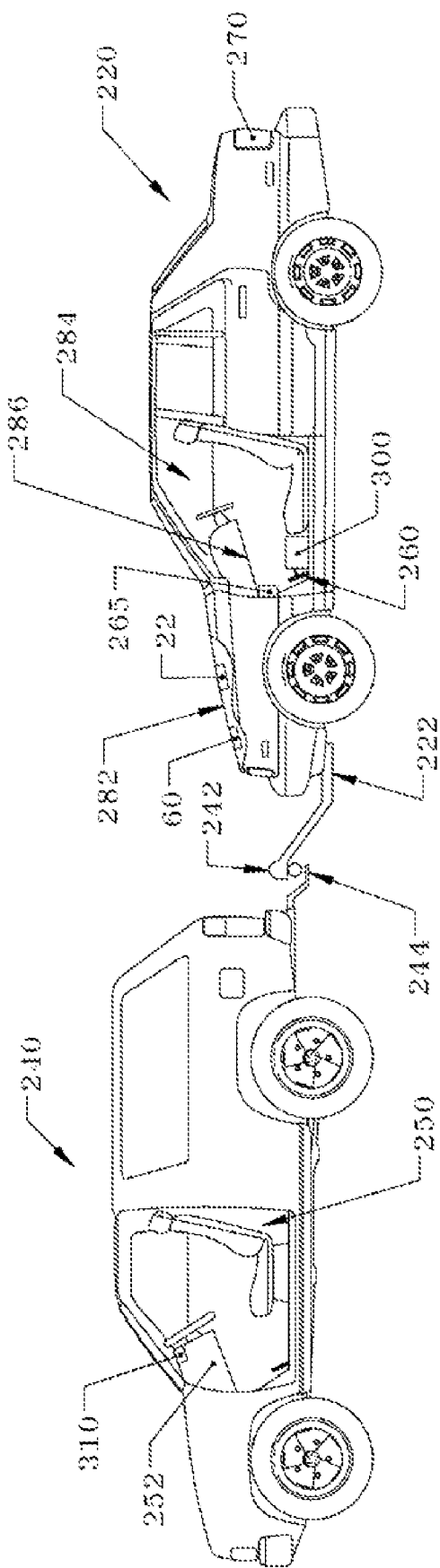
FIG. 1 is substantially a diagrammatic view of a towed and a towing vehicle.

With reference to FIG. 1, a side view of a towing vehicle 240 and a towed vehicle 220 having an auxiliary brake device 300 (or ABD) is shown. ABD 300 is used for stopping or slowing down the towed vehicle 220. ABD 300 resides in the towed vehicle 220. A display 310 may be mounted in the passenger compartment 250 of towing vehicle 240 for displaying one or more operating conditions about ABD 300 and other towed vehicle parameters to an operator of towing vehicle 240. ABD 300 supplements the brake system of a towing vehicle 240 in stopping or slowing down a vehicle being towed 220. In certain embodiments, ABD 300 provides auxiliary braking to towed vehicle 220 by contacting the towed vehicle's brake pedal 260 and depressing brake pedal 260 when appropriate. The depression of brake pedal 260 causes brake light switch 265 to close, turning on brake lights 270.

Towing vehicle 240 is illustrated as having a towing ball 242 coupled to a hitch 244. Hitch 244 is coupled to a suitable structure of the towed vehicle 220. Accordingly, when hitch 244 is coupled to towing ball 242, the towing vehicle 240 tows the towed vehicle 220. The above-described means of coupling the towing vehicle 240 and the towed vehicle 220 may be effected with any suitable means.

Towing vehicle 240 can have a passenger compartment 250 having a dashboard 252. Display 310 is illustrated as sitting on top of dashboard 252. In one embodiment, display 310 is affixed to dashboard 252 using any suitable means, such as Velcro, a strap, a bracket or the like. Display 310 may provide an indication to occupants of the towing vehicle that auxiliary brake system 300 and brake lights 270 are functioning as intended and/or, is not functioning as intended.

Towed vehicle 220 has an engine compartment 282 and a passenger compartment 284. Auxiliary braking device 300 is illustrated as sitting on the floor of towed vehicle 220 in front of a driver seat.

Figure 2:
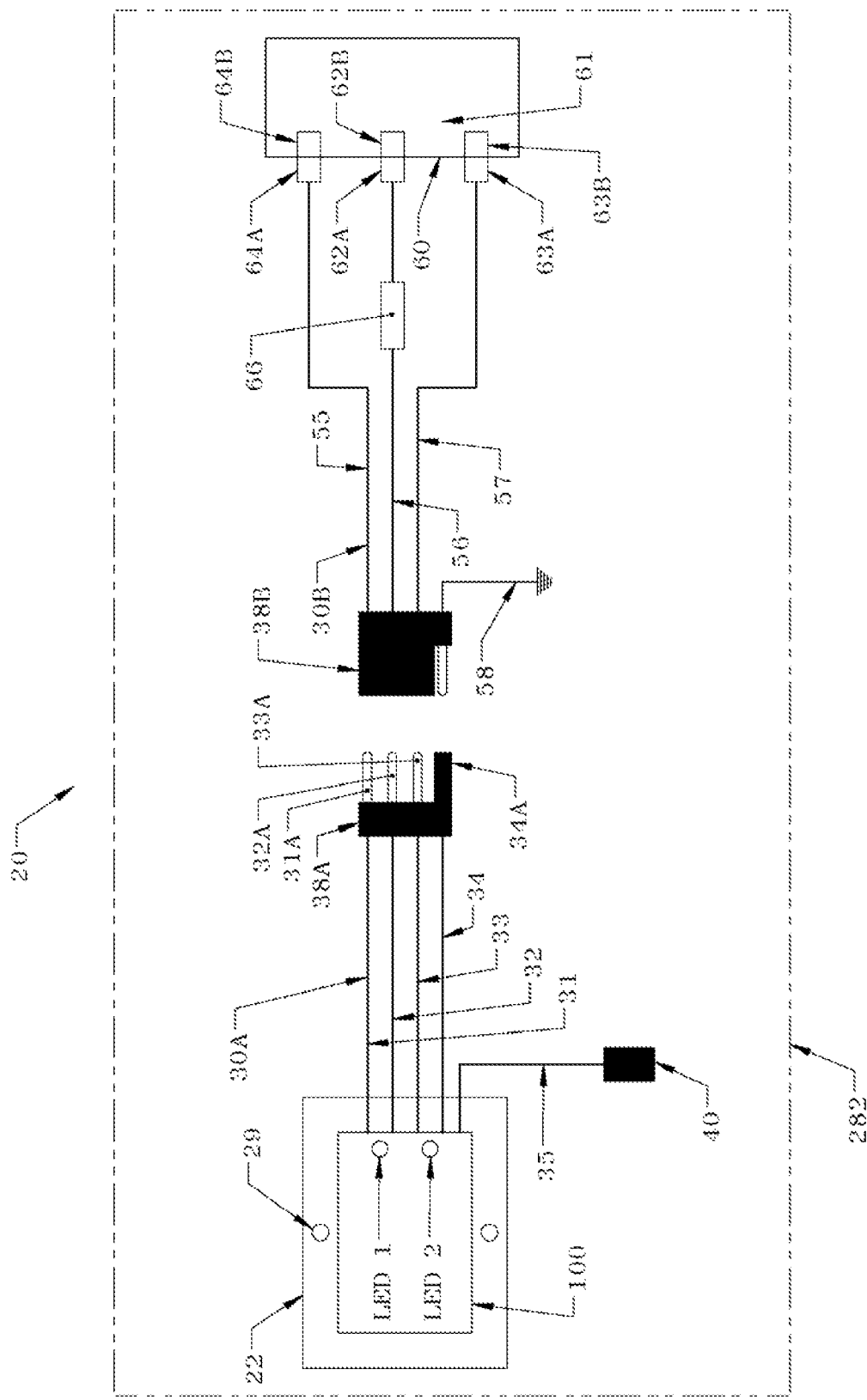
FIG. 2 is substantially a diagrammatic view of a voltage monitoring and switching device of the present invention installed in a towed vehicle.
Figure 3:
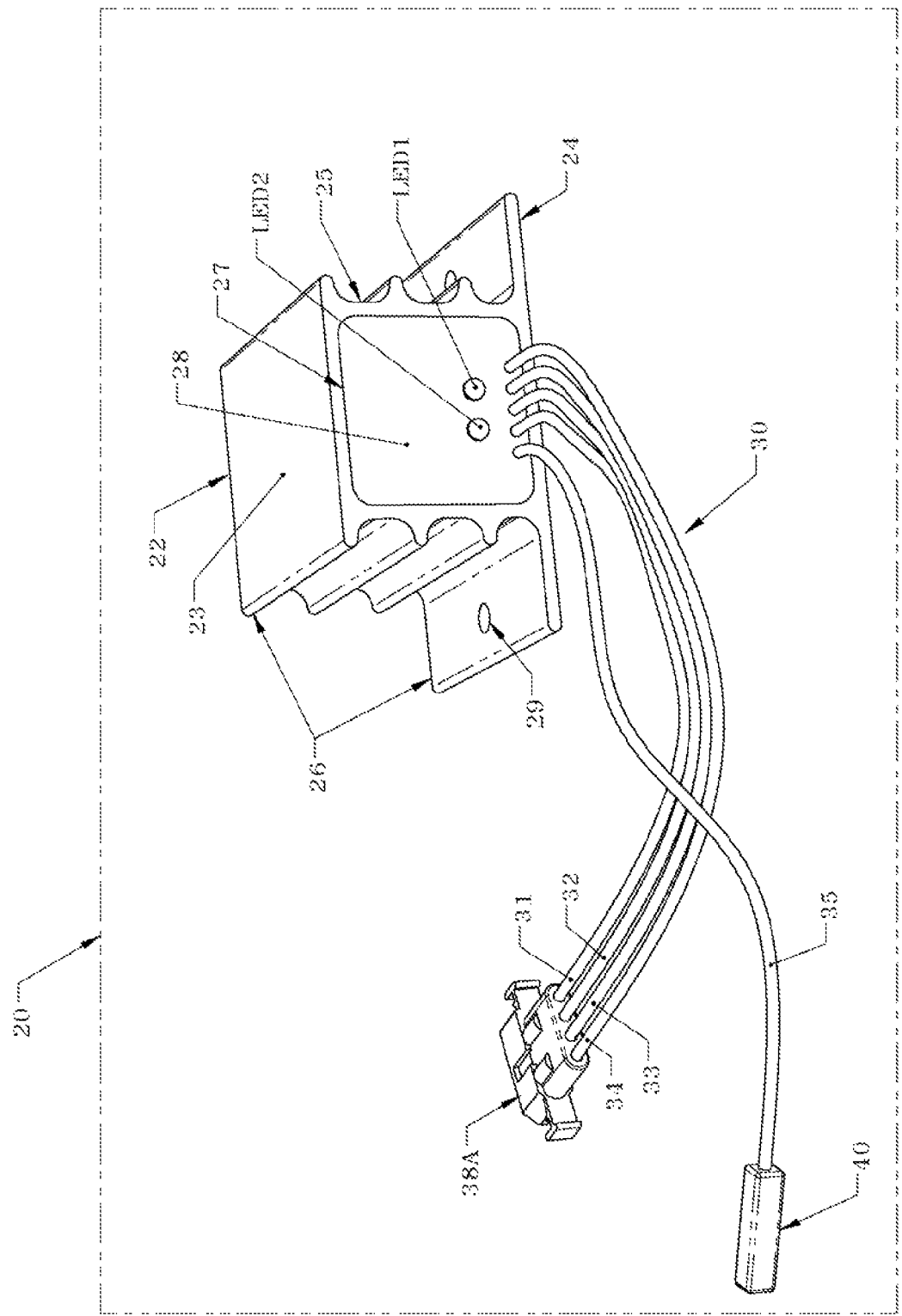
FIG. 3 is substantially an isometric view of a voltage monitoring and switching device in accordance with the present invention.

With reference now to FIGS. 1-3, a voltage monitoring and switching device 20 of the present invention is shown. Voltage monitoring and switching device 20 is adapted to be installed in a vehicle that is being towed. An example of a vehicle being towed is a trailer being towed by a towing vehicle. Another example of a towed vehicle is an automobile or truck that is being towed by a motorhome.

The towed vehicle can have an engine compartment 282 and a firewall/dashboard area 286. Voltage monitoring and switching device 20 can include a generally rectangular housing 22. Housing 22 can contain the components of the voltage monitoring and switching device and can also function as a heat sink. Housing 22 may have a top 23, bottom 24 and several side surfaces 25.

A plurality of cooling fins 26 may extend from side surfaces 25. Cooling fins 26 can expel heat generated by the operation of voltage monitoring and switching device 20. A hollow cavity 27 is defined within housing 22. Housing 22 may be formed of any metal with good heat conduction properties. For example, housing 22 may be formed from aluminum, copper or steel or from an alloy of various metals.

Several holes 29 may be located in one of cooling fins 26 and extend through to bottom 24. Holes 29 may be used to attach housing 22 within engine compartment 282. For example, housing 22 could be mounted to a support member within engine compartment 282 using a fastener such as a screw or bolt (not shown).

A printed circuit board 100 is mounted within cavity 27 and sealed therein with an epoxy 28. Various electronic components are mounted on printed circuit board 100 and will be described later in detail. A pair of light emitting diodes including a red LED 1 and a green LED 2 extend from epoxy 28 such that they may be viewed by a user when illuminated.

Wire harness 30 has two sections, section 30A and section 30B. Wire harness section 30A is connected to printed circuit board 100 and includes attached wires 31, 32, 33 and 34. The other end of wire harness section 30A terminates in a 4 pin connector plug 38A. Connector plug 38A is adapted to connect to or mate with connector plug 38B. Another wire 35 also is connected to printed circuit board 100 and extends from epoxy 28. The other end of wire 35 terminates in a connector 40 that can be in communication with a towing vehicle indicator or display 310.

Connector plug 38B has attached wires 55, 56, 57 and 58. The other end of wire 55 has a terminal 64A. The other end of wire 56 has a terminal 62A. The other end of wire 57 has a terminal 63A. The other end of wires 55, 56 and 57 can be connected to fuse box or panel 60. Fuse panel 60 typically is mounted in engine compartment 282. Fuse panel 60 is a conventional fuse panel that is found in vehicles. Fuse panel 60 typically contains a large number of fuses to protect various electrical devices within a vehicle from damage. For example, fuse panel 60 may contain fuses to protect a radio, dashboard lights, power window motors and brake lights from excessive currents.

Fuse panel 60 can include a brake light fuse socket 61 having fuse terminals 62B and 63B. Terminal 62A is the plus or hot side of the fuse. Fuse panel 60 may further include a switched 12 volt terminal 64B. Switched 12 volt terminal 64B is only operational when the vehicle ignition switch is in the "on" position. A brake light fuse can be plugged into brake light fuse socket 61. The brake light fuse can be removed and additional wires can be connected in place of the fuse.

Terminal 62A can press into and mate with terminal 62B on fuse panel 60 to form an electrical connection. Terminal 63A can press into and mate with terminal 63B on fuse panel 60 to form an electrical connection. Terminal 64A can press into and mate with terminal 64B on fuse panel 60 to form an electrical connection.

A fuse 66 is connected between wire 56 and the hot terminal 62A. Fuse 66 can be a 20 amp fuse and can replace the function of the fuse that was removed from socket 61. An end of wire 58 is connected to a common ground point in the engine compartment 282 such as the frame.

Wires 55, 56 and 57 extend from fuse panel 60 and connect to connector plug 38B. Connector plug 38B mates with connector plug 38A such that printed circuit board 100 is in communication with fuse panel 60. Wire harness 30 therefore connects fuse panel 60 with housing 22 and printed circuit board 100.

Circuit

Figure 4:
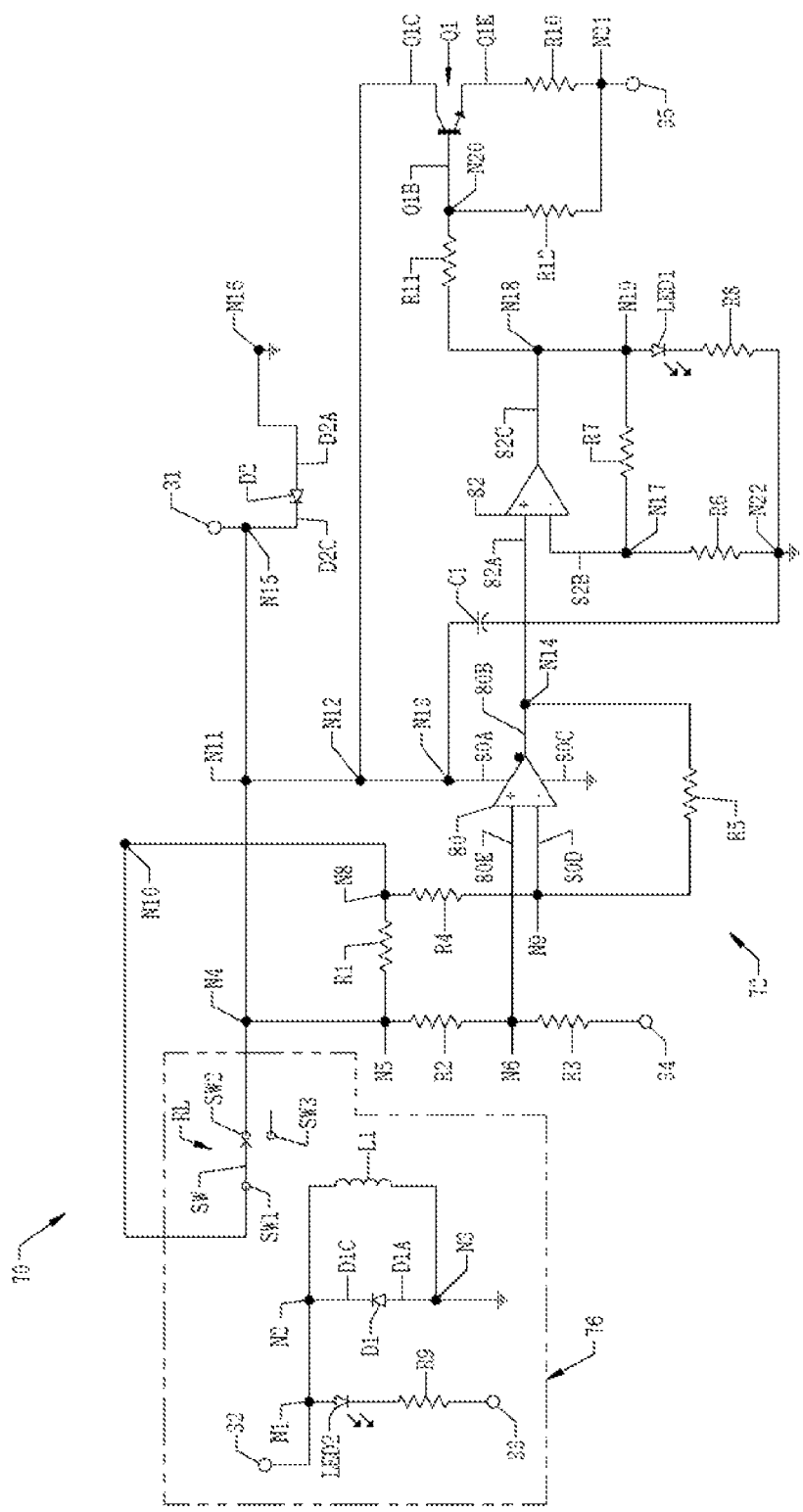
FIG. 4 is substantially a schematic diagram of the components of a voltage monitoring and switching device in accordance with the present invention.

Turning now to FIG. 4, a schematic diagram of the components of an embodiment of voltage monitoring and switching device 20 is shown. Voltage monitoring and switching device 20 may include a circuit 70. Circuit 70 can include a detector circuit 72 and a switching or relay circuit 76. Circuit 70 can be mounted to printed circuit board 100 (FIG. 2) using techniques known in the art.

Detector circuit 72 can include a pair of operational amplifiers 80 and 82 that are connected in a cascaded manner. Operational amplifiers 80 and 82 can be a model number LM358 dual operational amplifier. Operational amplifier 80 can have a power supply terminal 80A, output terminal 80B, ground terminal 80C, inverting input terminal 80D and non-inverting input terminal 80E. Power supply terminal 80A is connected to node N13 that is also connected to nodes N12 and N11. Ground terminal 80C is connected to a source of ground potential. Inverting input terminal 80D is connected to node N9, and non-inverting input terminal 80E is connected to node N6.

Resistor R5 is connected between node N14 and node N9. Resistor R4 is connected between node N8 and node N9. Resistor R1 is connected between node N5 and node N8. Resistor R2 is connected between node N5 and node N6. Resistor R3 is connected between node N6 and ground wire 34.

Operational amplifier 82 can have a non-inverting input terminal 82A, inverting input terminal 82B and output terminal 82C. Output terminal 80B is connected to node N14 that is also connected to non-inverting input terminal 82A. Output terminal 82C is connected to node N18 that is also connected to node N19. Node N17 is connected to inverting input terminal 82B.

Resistor R7 is connected between node N17 and node N19. Resistor R6 is connected between node N17 and node N22. Node N22 is also connected to ground. Resistor R8 is connected between node N22 and light emitting diode LED1. Light emitting diode LED 1 is connected between resistor R8 and node N19. Capacitor C1 is connected between node N22 and node N13. Node N13 is also connected to node N12 that is also coupled to node N11.

An NPN transistor Q1 has a base Q1B, a collector Q1C and an emitter Q1E. Base Q1B is connected to node N20. Resistor R11 couples the output of operational amp 82 to transistor Q1 between nodes N18 and N20. Resistor R10 is connected between emitter Q1E and node N21. Resistor R12 is connected between node N20 and node N21. Node N21 is connected to wire 35.

Circuit 70 can further include a diode D2 having a cathode D2C and an anode D2A. Anode D2A is connected to ground. Cathode D2C is connected to wire 31, which is connected to the 12 volt switched power source. Node N15 is connected to node N11.

Circuit 70 can further include a switching or relay circuit 76 that is connected in series with the brake light fuse terminals. Relay circuit 76 can include diode D1 having a cathode D1C and an anode D1A. Anode D1A is connected to node N3 that is connected to ground. Cathode D1C is connected to node N2. Relay RL can include a coil L1 and a single pole double throw switch SW. Switch SW has terminals SW1, SW2 and SW3. Coil L1 is connected between nodes N2 and N3 or across diode D1.

Switching circuit 76 further includes a light emitting diode LED2 connected in series with resistor R9 between node N1 and wire 33. Node N1 is coupled with wire 32. Switch terminal SW1 is connected to node N10. Node N10 is connected to node N8. Switch terminal SW2 is connected to node N4 that is also coupled to node N5.

Because wire 32 is connected to terminal 62B (FIG. 2) and wire 33 is connected to terminal 63B (FIG. 2), switching circuit 76 is connected in series with brake light switch 265.

Method of Installation

Figure 5:
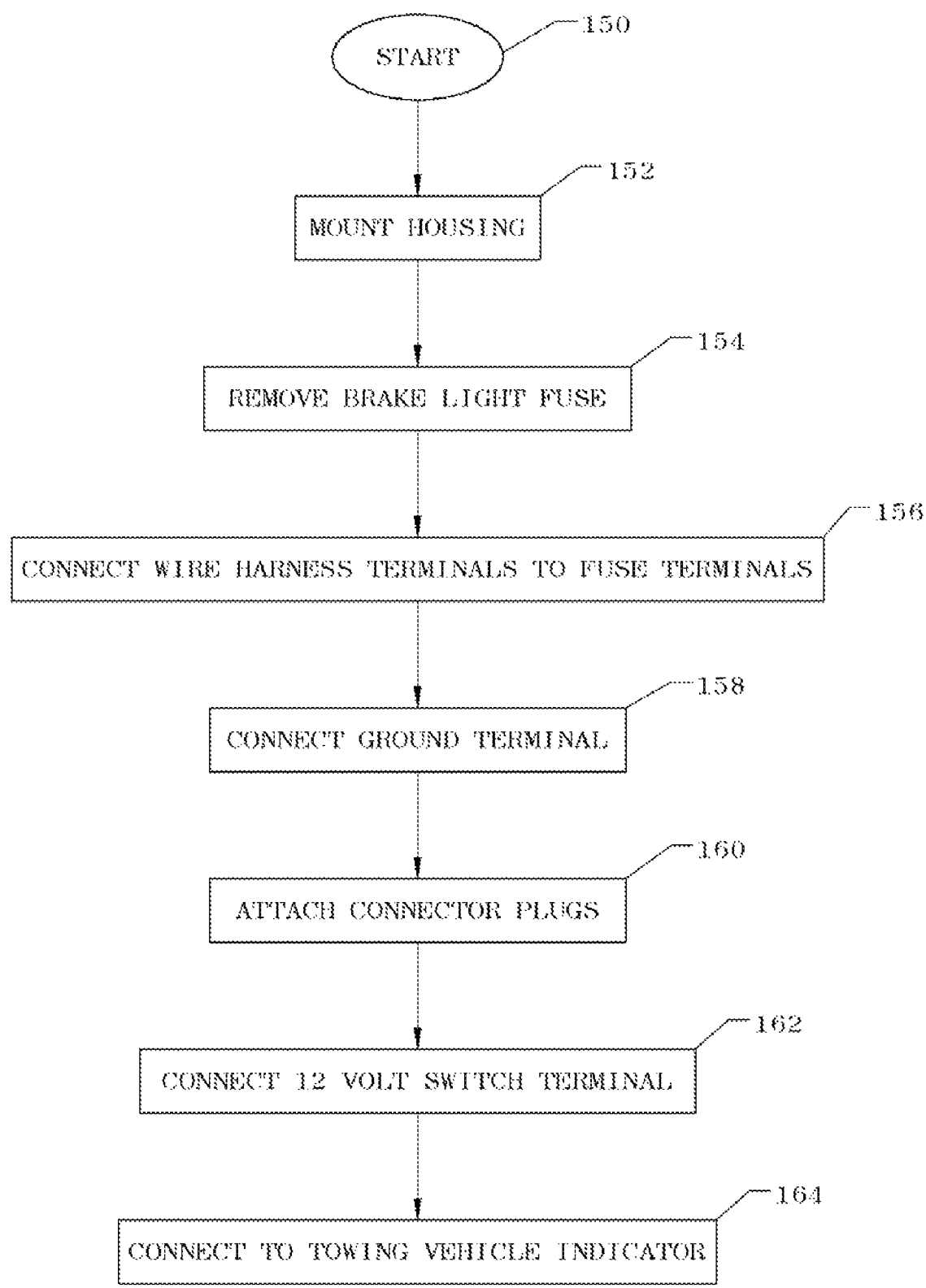
FIG. 5 is substantially a method of installing the present invention.

Referring now to FIG. 5, a method of installation of voltage monitoring and switching device 20 in a towed vehicle is shown. Method 150 includes mounting the housing within the engine compartment at step 152. At step 154, the brake light fuse is removed. The wire harness terminals are connected to the brake light fuse terminals in step 156. Next, the ground terminal is connected at step 158. At step 160, the two connector plugs are mated. The 12 volt switched terminal is connected to the fuse panel at step 162. At step 164, the output signal connector 40 (FIG. 2) is connected to display 310 in the towing vehicle.

Operation

Voltage monitoring and switching device 20 operates in the following manner. With reference to FIGS. 1-4, when the brake pedal 260 of the towed vehicle 220 is depressed, the brake light switch 265 is closed. Closing of the brake light switch 265 causes a voltage to be applied between terminals 62B and 63B of fuse panel 60 and also between wires 32 and 33 through connector plugs 38A and 38B. This causes the activation of relay circuit 76.

When a voltage is applied between wires 32 and 33, red LED2 is turned on or illuminated. The illumination of red LED2 is used during installation of device 20 to confirm that device 20 is correctly connected and properly operating. Current flows through wires 32 and 33 back to panel 60 allowing a circuit to be completed that illuminates the brake lights 270 of the towed vehicle 220. At the same time, coil L1 of relay R1 is energized creating a magnetic field that closes the relay and moves switch SW from switch position SW3 to switch position SW2.

When relay R1 is closed and wire 31 is powered from the switched ignition terminal 64, a voltage will be applied to detector circuit 72 causing activation of detector circuit 72. When detector circuit 72 is turned on, cascaded operational amplifiers 80 and 82 will power or illuminate green LED1. Operational amplifiers 80 and 82 provide the correct voltages to power LED2 and to bias transistor Q1. Operational amplifiers 80 and 82 also buffer LED1 from the switched 12 volt supply. Green LED2 can indicate to an installer of device 20 that device 20 has been properly installed. At the same time, the output from operational amplifier 82 will bias the base Q1B of transistor Q1 such that transistor Q1 turns on. When transistor Q1 turns on, an electrical signal is provided on wire 35 and sent to display 310 that indicates that the towed vehicle pedal 260 has been depressed and that brake lights 270 have been illuminated.

CONCLUSION

The present invention provides a voltage monitoring and switching device that can be connected with a brake light switch without having to cut brake light switch wires. The present invention allows for monitoring of a brake light switch and generates an electrical signal that a brake pedal has been depressed.

Although the description above contains many specifications, these should not be construed as limiting the scope of the invention but as merely providing illustrations of some of present embodiments of this invention. Thus, the scope of the invention should be determined by the appended claims and their legal equivalents rather than by the examples given.

What is claimed is:

1. A monitoring and switching device for indicating operation of at least one of brakes lights of a towed vehicle and an auxiliary braking system in the towed vehicle to an operator of a towing vehicle, comprising:

(A) a relay circuit connected between first and second brake light fuse terminals of the towed vehicle in place of a brake light fuse and that uses a voltage between the first and second brake light fuse terminals to activate the relay; and (B) a detection circuit in communication with the relay circuit, wherein the detection circuit detects closing of the relay circuit and sends an electrical signal that the relay circuit has been closed, indicating operation of the at least one of the brakes lights of the towed vehicle and an auxiliary braking system in the towed vehicle.

2. The switching device of claim 1, wherein the switching device is connected to the first and second fuse terminals through a wire harness.

3. The switching device of claim 1, wherein the electrical signal is provided to a display.

4. The switching device of claim 1, wherein the relay circuit and the detection circuit are mounted in a housing.

5. The switching device of claim 4 wherein the housing is mounted in a towed vehicle engine compartment.

6. The switching device of claim 4, wherein the housing has a plurality of cooling fins.

7. The switching device of claim 1, wherein the relay circuit further includes a first light emitting diode, the first light emitting diode indicating that a voltage is present between the first and second terminals.

8. The switching device of claim 1, wherein the detection circuit further includes a second light emitting diode, the second light emitting diode indicating that the detection circuit is connected to a voltage source.

9. The switching device of claim 1 wherein the electrical signal indicates operation of the brakes lights of the towed vehicle.

10. The switching device of claim 1 wherein the electrical signal indicates operation of the auxiliary braking system in the towed vehicle.

11. A method of switching a brake light of a vehicle being towed by a towing vehicle, comprising:
(A) disconnecting a brake light fuse from between first and second brake light fuse terminals of the towed vehicle;
(B) connecting a relay circuit between the first and second brake light fuse terminals of the towed vehicle;
(C) detecting an electrical signal between the first and second brake light fuse terminals using the relay circuit, the electrical signal indicating activation of a brake light of the towed vehicle; and
(D) sending a signal that the brake light has been activated.

12. The method of claim 11, wherein the signal is sent to a towed vehicle braking device.

13. The method of claim 11, wherein the signal is sent to a display.

14. The method of claim 13, wherein the display is mounted in a towing vehicle.

15. The method of claim 11, wherein the electrical signal is sent to a display.

16. The method of claim 11 comprising:
(A) disconnecting a first brake light fuse terminal from the brake light fuse;
(B) connecting the first brake light fuse terminal to a first relay circuit terminal;
(C) disconnecting a second brake light fuse terminal from the brake light fuse; and
(D) connecting the second brake light fuse terminal to a second relay circuit terminal.

17. A monitoring and switching device for indicating operation of at least one of brake lights of a towed vehicle and an auxiliary braking system in the towed vehicle, comprising:
(A) relay circuit means for closing a switch means, the relay circuit means comprising first and second terminal means for connecting to first and second brake light fuse terminal means, respectively, in place of a brake light fuse, wherein the switch means uses a voltage between the first and second brake light fuse terminals to activate the relay circuit means; and
(B) detection means for (a) detecting closing of the switch means, and (b) to send an electrical signal indicating that the switch means has been closed, to indicate operation of the at least one of brake lights of the towed vehicle and the auxiliary braked system in the towed vehicle.

18. The device of claim 17, wherein the electrical signal is sent to a towed vehicle braking device.

19. The system of claim 17 wherein the monitoring and switching device is disposed within an engine compartment of the towed vehicle.

\* \* \* \* \*